US006924998B2

United States Patent
Kang

(10) Patent No.: US 6,924,998 B2
(45) Date of Patent: Aug. 2, 2005

(54) FERAM USING PROGRAMMABLE REGISTER

(75) Inventor: Hee Bok Kang, Daejeon (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 7 days.

(21) Appl. No.: 10/740,892

(22) Filed: Dec. 22, 2003

(65) Prior Publication Data

US 2005/0052895 A1 Mar. 10, 2005

(30) Foreign Application Priority Data

Sep. 8, 2003 (KR) .............................. 10-2003-0062760

(51) Int. Cl.$^7$ ............................................. G11C 11/22
(52) U.S. Cl. .................................. 365/145; 365/189.09
(58) Field of Search ............................ 365/189.09, 145

(56) References Cited

U.S. PATENT DOCUMENTS

| 5,396,113 A | * | 3/1995 | Park et al. | ................... | 327/543 |
| 6,081,453 A | * | 6/2000 | Iwahashi | ............... | 365/185.22 |
| 6,215,692 B1 | * | 4/2001 | Kang | ........................ | 365/145 |

FOREIGN PATENT DOCUMENTS

KR   1019980014400   7/2000

\* cited by examiner

Primary Examiner—Michael Tran
(74) Attorney, Agent, or Firm—Heller Ehrman LLP

(57) ABSTRACT

A nonvolatile ferroelectric memory device includes a cell array having a multi-bitline structure for converting a sensing voltage of a sub bitline into current to induce a sensing voltage of a main bitline. The memory device comprises a plurality of cell array blocks, a common data bus, a sense amplifier array unit and a reference voltage controller. The common data bus, shared by the plurality of cell array blocks, transmits cell data of the cell array blocks. The sense amplifier array unit compares a reference voltage with cell data applied from the common data bus and senses the cell data. The reference voltage controller generates an adjustable internal reference voltage by adjusting a ferroelectric capacitance, selectively switches the internal reference voltage and an external reference voltage applied from a pad, and outputs the selectively switched value as the reference voltage into the sense amplifier array unit. In the memory device, cell characteristics can be tested without extra mask layer processes by programmably selecting reference voltages. Additionally, weak cells are effectively repaired by regulating reference voltages programmably, thereby improving yield and reliability of a chip.

11 Claims, 14 Drawing Sheets

FERAM USING PROGRAMMABLE REGISTER

BACKGROUND OF THE INVENTION

1. Field of the Invention

The present invention generally relates to a nonvolatile ferroelectric memory device, and more specifically, to a nonvolatile ferroelectric memory device which changes reference voltages and timing logically to directly perform a test on all cells of a chip by using a programmable register.

2. Description of the Prior Art

Generally, a ferroelectric random access memory (hereinafter, referred to as 'FRAM') has a data processing speed as fast as a Dynamic Random Access Memory DRAM and conserves data even after the power is turned off.

The FRAM having structures similar to the DRAM includes the capacitors made of a ferroelectric substance, so that it utilizes the characteristic of a high residual polarization of the ferroelectric substance in which data is not deleted even after an electric field is eliminated.

The technical contents on the above FRAM are disclosed in the Korean Patent Application No. 1999-14400 by the same inventor of the present invention. Therefore, the basic structure and the operation on the FRAM are not described herein.

In the initial development stage of the FeRAM, it is necessary to extract cell data for characteristic evaluation of cell arrays.

However, in a conventional cell array, it is impossible to perform a self-test on characteristics of cells on a chip under development. As a result, the characteristics of cells are indirectly tested with an additional test chip.

Also, an additional test mode setting method is required to perform a test on characteristics of a chip in various regions of the conventional FeRAM. In other words, it is necessary to evaluate cell characteristics by externally regulating levels of sensing reference voltages manually to perform a test only on characteristics of cell arrays. Additionally, for quantitative analysis of characteristics of cell arrays, the levels of the sensing reference voltages are to be set as appropriate levels.

In order to set appropriate levels of the sensing reference voltages in the conventional FeRAM, after metal lines are formed with an additional mask, characteristics of each chip are evaluated. Then, a chip is completed by changing a corresponding layer mask with feedback of the evaluation results on the characteristics.

However, additional masks and additional wafer processes are required to set a test mode, which results in damage to cost and time.

SUMMARY OF THE INVENTION

Accordingly, it is an object of the present invention to easily exchange a test mode using a reference voltage applied externally from a pad with an internal reference usage mode using an internally generated reference voltage.

It is another object of the present invention to easily evaluate data characteristics of cells without additional mask layer process by regulating reference voltage levels at random to find and repair weak cells effectively, thereby improving yield and reliability of a chip.

In an embodiment, a nonvolatile ferroelectric memory device includes a cell array having a multi-bitline structure for converting a sensing voltage of a sub bitline into current to induce a sensing voltage to a main bitline. The nonvolatile ferroelectric memory device comprises a plurality of cell array blocks, a common data bus, a sense amplifier array unit and a reference voltage controller. Each cell array block comprises the above-described cell array. The common data bus, shared by the plurality of cell array blocks, transmits cell data of the cell array blocks. The sense amplifier array unit compares a reference voltage with cell data applied from the common data bus and senses the cell data. The reference voltage controller is configured to have same condition as that of the cell array blocks and generates an adjustable internal reference voltage by adjusting a size of a ferroelectric capacitor, selectively switches the internal reference voltage and an external reference voltage applied from a pad, and outputs the selectively switched value as the reference voltage into the sense amplifier array unit.

DETAILED DESCRIPTION OF THE PREFERRED EMBODIMENTS

The present invention will be described in detail with reference to the accompanying drawings.

Figure 1:
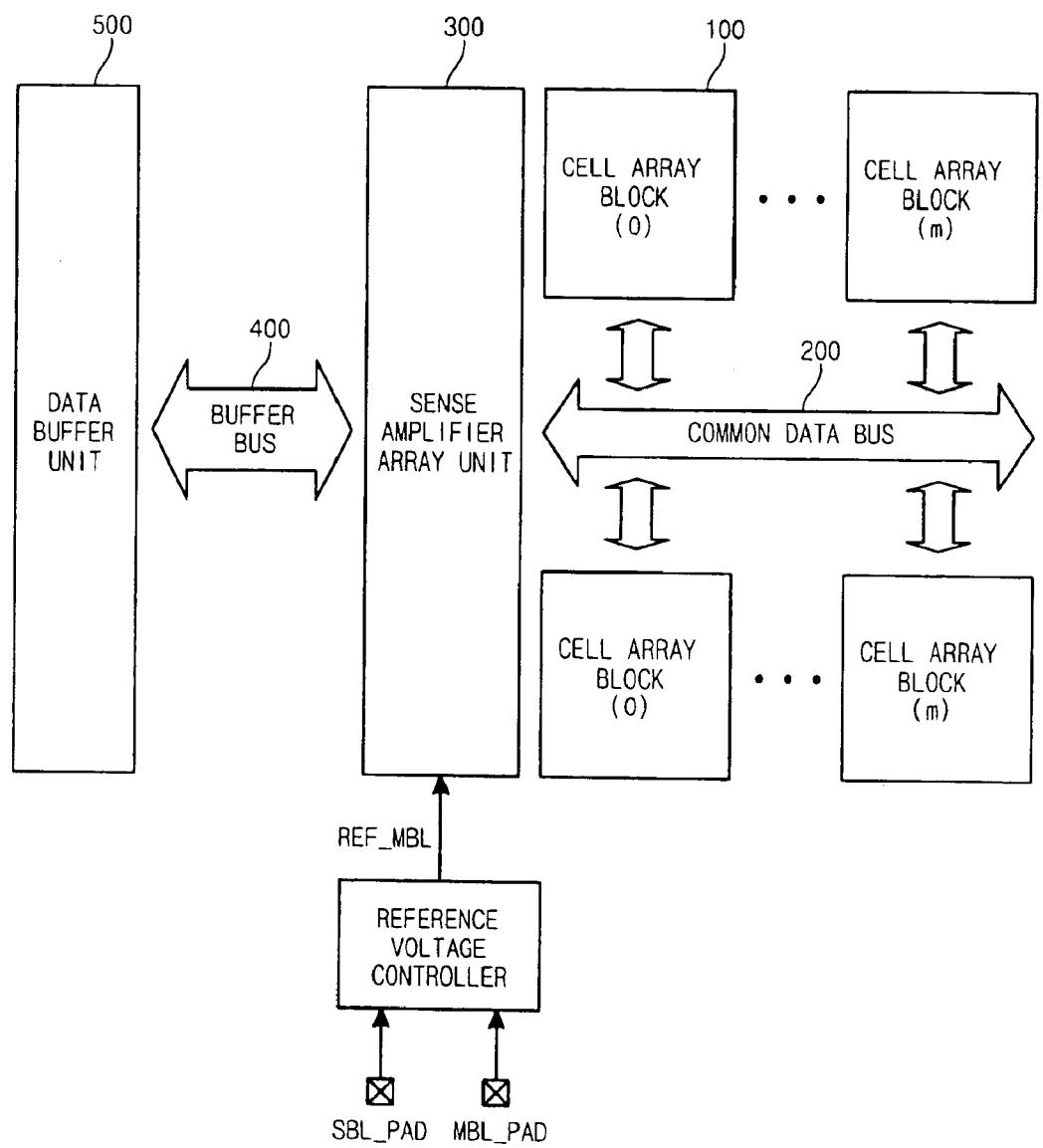
FIG. 1 is a diagram illustrating a structure of a ferroelectric memory device according to an embodiment of the present invention.

FIG. 1 is a diagram illustrating a structure of a ferroelectric memory device according to an embodiment of the present invention.

In an embodiment, the nonvolatile ferroelectric memory device comprises a plurality of cell array blocks 100, a common data bus 200, a sense amplifier array unit 300, a data buffer bus 400, a data buffer unit 500 and a reference voltage controller 600.

Each cell array block 100 comprises a plurality of sub cell arrays for storing data, and is located symmetrically on a basis of the common data bus 200. Each cell array block 100 has a multi-bitline structure comprising a plurality of sub bitlines connected to a main bitline wherein a sensing voltage of the sub bitline is converted into current to induce a main bitline sensing voltage. The plurality of cell array blocks 100 share the common data bus 200.

The sense amplifier array unit 300 is connected to the cell array blocks 100 through the common data bus 200. The sense amplifier array unit 300 senses cell data of the cell array blocks 100 applied to the common data bus 200, and outputs the sensed data into the data buffer bus 400.

The data buffer unit 500 buffers externally inputted write data and read data outputted from the sense amplifier array unit 300.

The reference voltage controller 600 configured to have the same condition as that of the cell array block 100 generates an internal reference voltage whose level is programmably adjusted. The reference voltage controller 600 selectively switches an internal reference voltage and an external reference voltage applied externally from a pad with a programmable ferroelectric register, and outputs the selectively switched value as a reference voltage REF_MBL of the sense amplifier array unit 300.

Figure 2:
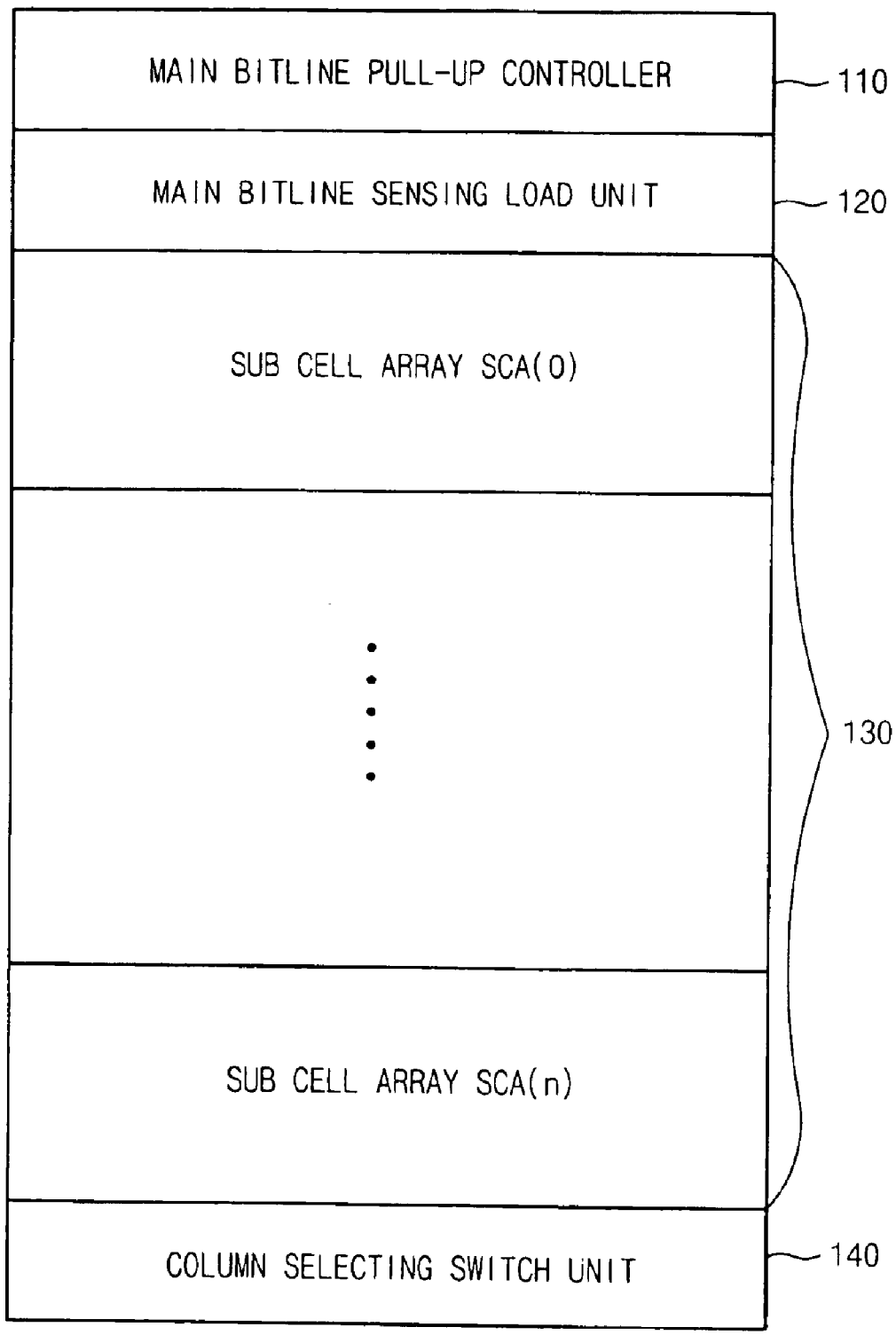
FIG. 2 is a diagram illustrating a structure of a cell array block of FIG. 1.

FIG. 2 is a diagram illustrating a structure of a cell array block 100 of FIG. 1.

The cell array block 100 comprises a main bitline pull-up controller 110, a main bitline sensing load unit 120, a plurality of sub cell arrays 130 and a column selecting switch unit 140.

Figure 3:
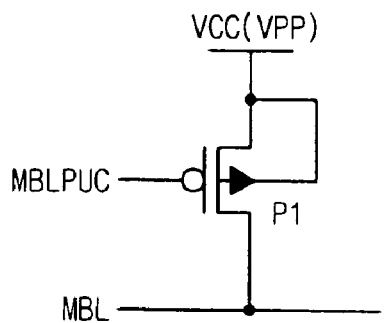
FIG. 3 is a circuit diagram of a main bitline pull-up controller of FIG. 2.

FIG. 3 is a circuit diagram of the main bitline pull-up controller 110 of FIG. 2.

The main bitline pull-up controller 110 comprises a PMOS transistor P1 for pulling up a main bitline MBL in response to a pull-up control signal MBLPUC in a precharge mode.

The PMOS transistor P1 has a source connected to a power voltage VCC (or VPP), a drain connected to the main bitline MBL and a gate to receive the main bitline pull-up control signal MBLPUC. The PMOS transistor P1 supplies the power voltage VCC (or VPP) to the main bitline MBL in response to the main bitline pull-up control signal MBLPUC.

Figure 4:
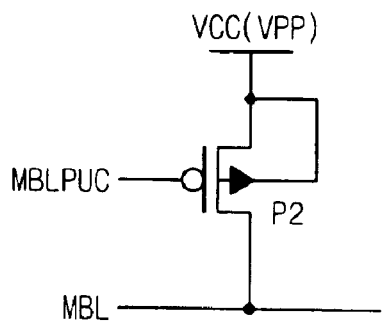
FIG. 4 is a circuit diagram of a main bitline sensing load unit of FIG. 2.

FIG. 4 is a circuit diagram of the main bitline sensing load unit 120 of FIG. 2.

The main bitline sensing load unit 120 comprises a PMOS transistor P2 for controlling sensing load of the main bitline MBL. The PMOS transistor P2 has a source connected to the power voltage VCC, a drain connected to the main bitline MBL and a gate to receive a main bitline control signal MBLC.

Figure 5:
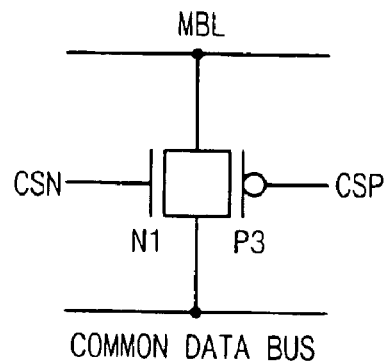
FIG. 5 is a circuit diagram of a column selecting switch unit of FIG. 2.

FIG. 5 is a circuit diagram of the column selecting switch unit 140 of FIG. 2.

The column selecting switch unit 140 selectively connects the common data bus 200 to the main bitline MBL in response to column selecting signals CSN and CSP. The column selecting switch unit 140 comprises an NMOS transistor N1 and a PMOS transistor P3 connected in parallel between the main bitline MBL and the common data bus 200. The NMOS transistor N1 has a gate to receive the column selecting signal CSN and the PMOS transistor P3 has a gate to receive the column selecting signal CSP.

Figure 6:
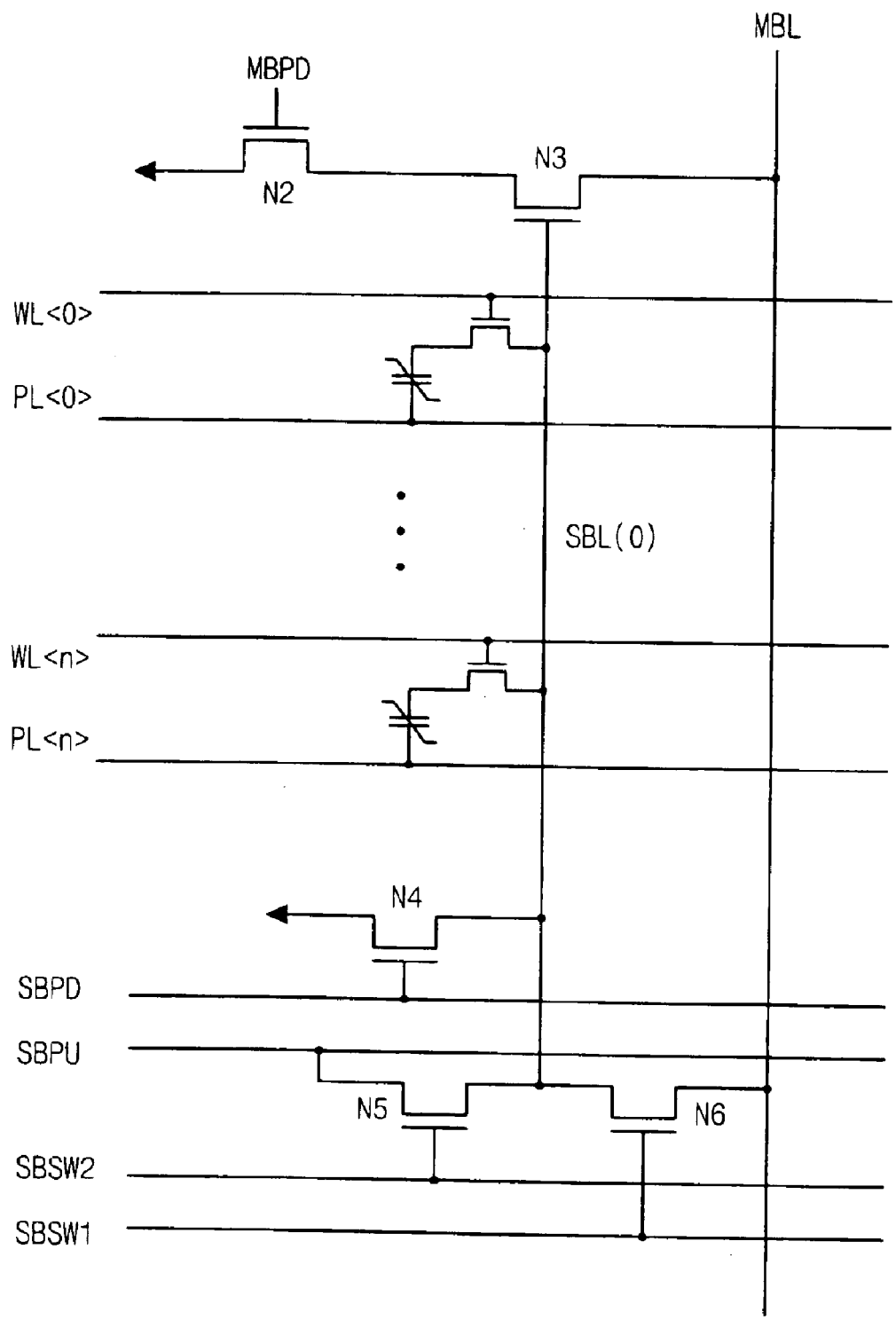
FIG. 6 is a circuit diagram of a unit sub cell array of sub cell arrays of FIG. 2.

FIG. 6 is a circuit diagram of a unit sub cell array of sub cell arrays of FIG. 2.

In the cell array block 100, one main bitline MBL is selectively connected to a plurality of sub bitlines SBL(0)~SBL(n). The main bitline MBL is shared by a plurality of sub cell arrays SCA(0)~SCA(n). Each sub bitline SBL(0)~SBL(n) is comprised in each sub cell arrays SCA(0)~SCA(n), respectively. The main bitline MBL is selectively connected to one sub bitline in one operation.

In the sub cell array SCA(0) of FIG. 6, the main bitline MBL is selectively connected to the sub bitline SBL(0). IF one of a plurality of sub bitline selecting signals SBSW1 is activated, an NMOS transistor N6 is turned on. As a result, load of the main bitline MBL is adjusted to a level of the load of the sub bitline SBL(0). If a sub bitline pull-down signal SBPD is activated to turn on an NMOS transistor N4, the sub bitline SBL(0) is adjusted to a ground voltage level.

The sub bitline pull-up signal SBPU regulates power to be supplied to the sub bitline SBL(0). A sub bitline selecting signal SBSW2 regulates signal flow between the sub bitline pull-up signal SBPU and the sub bitline SBL(0).

To generate a high voltage in a low voltage, a voltage higher than the power voltage VCC is to be supplied as the sub bitline pull-up signal SBPU. Next, if the sub bitline selecting signal SBSW2 is activated to turn on an NMOS transistor N5, a high voltage is supplied to the sub bitline SBL(0).

A plurality of cells are connected to the sub bitline SBL(0).

An NMOS transistor N2, connected between a ground voltage and an NMOS transistor N3, has a gate to receive a main bitline pull-down signal MBPD. The NMOS transistor N3, connected between the NMOS transistor N2 and the main btiline MBL, has a gate connected to the sub bitline SBL(0). When the main bitline pull-down signal MBPD is activated, the NMOS transistor N3 converts a sensing voltage of the sub bitline SBL(0) into current, thereby inducing a sensing voltage of the main bitline MBL.

For example, if cell data is high, the voltage of the sub bitline SBL(0) becomes higher. As a result, the amount of current flowing through the NMOS transistor N3 becomes larger to pull down the voltage level of the main bitline MBL greatly. However, if cell data is low, the voltage of the sub bitline SBL(0) becomes lower. As a result, the amount of current flowing through the NMOS transistor N3 becomes smaller to pull down the voltage level of the main bitline MBL slightly. In this way, the main bitline MBL has a voltage level difference depending on cell data, and data can be sensed using the difference.

Figure 7:
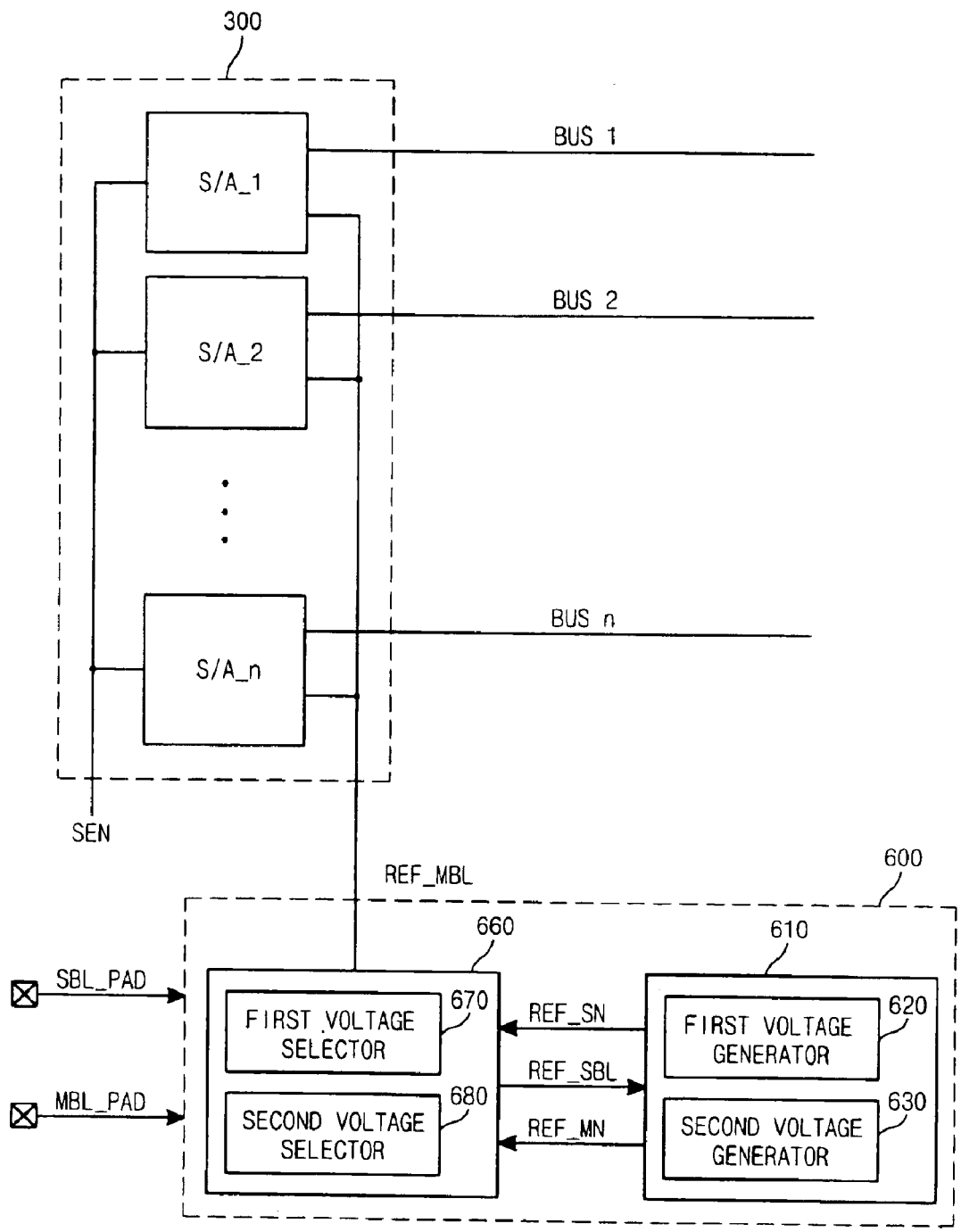
FIG. 7 is a diagram illustrating a structure and an operation of a sense amplifier array unit and a reference voltage controller of FIG. 1.

FIG. 7 is a diagram illustrating a structure and an operation of the sense amplifier array unit 300 and the reference voltage controller 600 of FIG. 1.

The sense amplifier array units 300 are connected one by one to a plurality of bus lines BUS1~BUSn. The sense amplifier array unit 300 comprises a plurality of sense amplifiers S/A1~S/An for sensing a difference between a sensing voltage of each bus line BUS1~BUSn and the reference voltage REF_MBL from the reference voltage controller 600 and amplifying the difference. The reference voltage REF_MBL is regulated by the reference voltage controller 600. The sense amplifiers S/A1~S/An are activated in response to a sensing signal SEN.

The reference voltage controller 600 comprises a reference voltage generator 610 and a reference voltage selector 660.

The reference voltage generator 610 is configured to have the same condition as that of the cell array block 100. The reference voltage generator 610 adjusts a level of a first reference level adjusting signal REF_SN programmably, and outputs the adjusted signal into the reference voltage selector 660. The reference voltage generator 610 induces an internal reference voltage REF_MN in response to a level of a third reference level adjusting signal REF_SBL applied from the reference voltage selector 660, and outputs the induced signal into the reference voltage selector 660. The reference voltage generator 610 comprises a first voltage generator 620 and a second voltage generator 630.

The reference voltage selector 660 selectively switches the first reference level adjusting signal REF_SN and a second reference level adjusting signal SBL_PAD applied externally through a pad by using a first programmable ferroelectric register (not shown), and outputs the selectively switched value as the third reference level adjusting signal REF_SBL. The reference voltage selector 660 selectively switches the internal reference voltage REF_MN and an external reference voltage MBL_PAD applied externally from a pad, and outputs the reference voltage REF_MBL into the sense amplifier array unit 300. The reference voltage selector 660 comprises a first voltage selector 670 and a second voltage selector 680.

Figure 8:
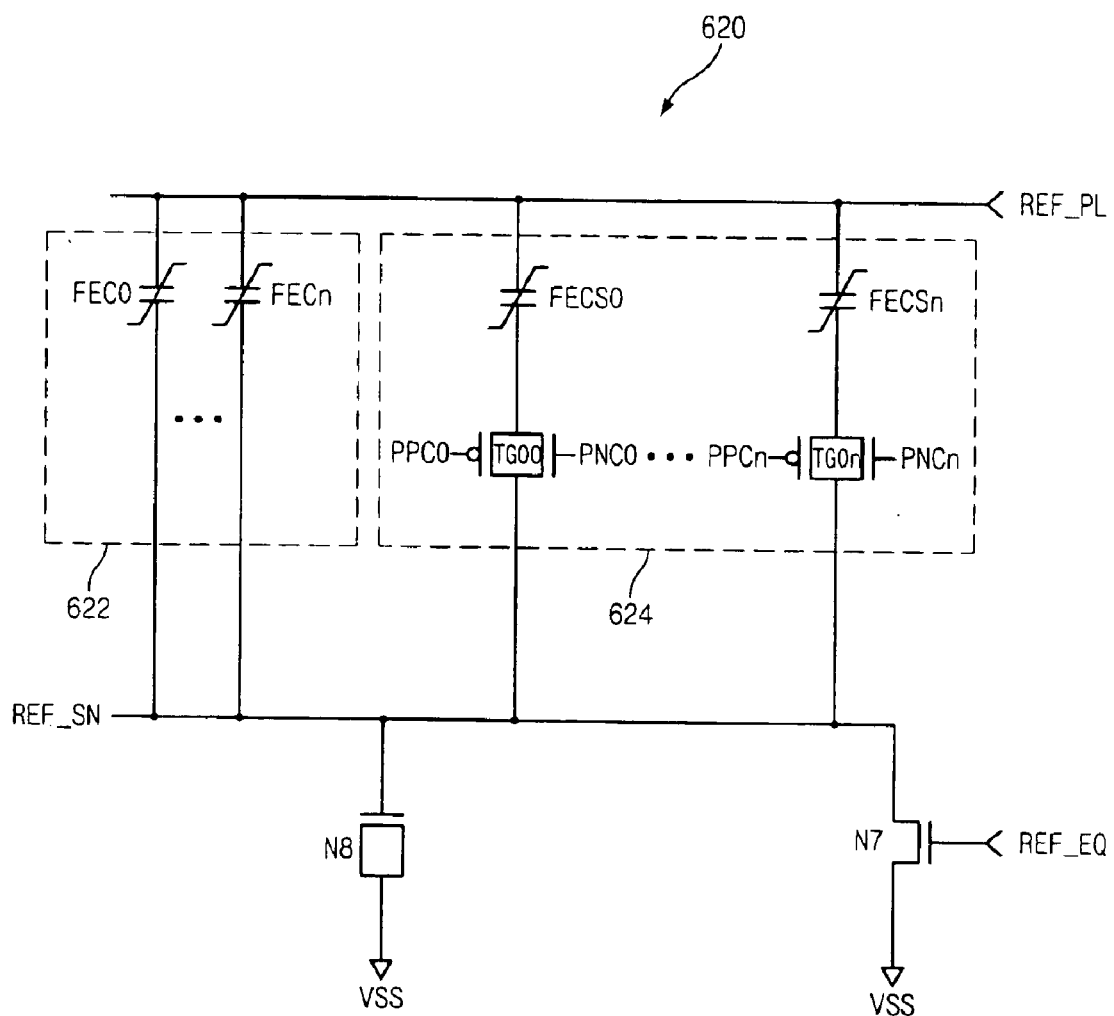
FIG. 8 is a circuit diagram of a first voltage generator of FIG. 7.

FIG. 8 is a circuit diagram of the first voltage generator 620 of FIG. 7.

The first voltage generator 620 is configured to have the same condition as that of the cell array to induce a sensing voltage to each sub bitline SBL of sub cell arrays SCA(0)~SCA(n). The first voltage generator 620 generates the first reference level adjusting signal REF_SN having a desired level by regulating a ferroelectric capacitance programmably.

The first voltage generator 620 comprises a fixed voltage generator 622, a voltage regulator 624 and NMOS transistors N7 and N8. The fixed voltage generator 622 outputs a voltage having a predetermined level depending on a driving voltage REF_PL. The voltage regulator 624 regulates a level of a output voltage in response to the driving voltage REF_PL and programmably adjusted switching control signals PPC0~PPCn and PNC0~PNCn. The NMOS transistor N7 precharges the first reference level adjusting signal REF_SN to the ground voltage VSS in response to a reference equalizing signal REF_EQ. The NMOS transistor N8 applies load capacitance to an output terminal to output the first reference level adjusting signal REF_SN. Here, a node to receive the driving voltage REF_PL corresponds to a plateline PL in the cell array block 100. The output terminal to output the first reference level adjusting signal REF_SN corresponds to the sub bitline SBL of the cell array block 100.

The fixed voltage generator 622 comprises a plurality of ferroelectric capacitors FEC0~FECn connected in parallel for receiving the driving voltage REF_PL in common and outputting a charged voltage into an output terminal of the first reference level adjusting signal REF_SN.

The voltage regulator 624 comprises a plurality of ferroelectric capacitors FECS0~FECSn, and a plurality of transmission gates TG00~TG0n. The ferroelectric capacitors FECS0~FECSn are connected one by one to the transmission gates TG00~TG0n between the node to receive the driving voltage REF_PL and the transmission gates TG00~TG0n. The ferroelectric capacitors FECS0~FECSn output the charged voltage when the ferroelectric capacitor receives the driving voltage REF_PL in common. The transmission gates TG00~TG0n selectively transmit charges voltages of the ferroelectric capacitors FECS0~FECSn in response to the programmably adjusted switching control signals PPC0~PPCn and PNC0~PNCn.

Figure 9:
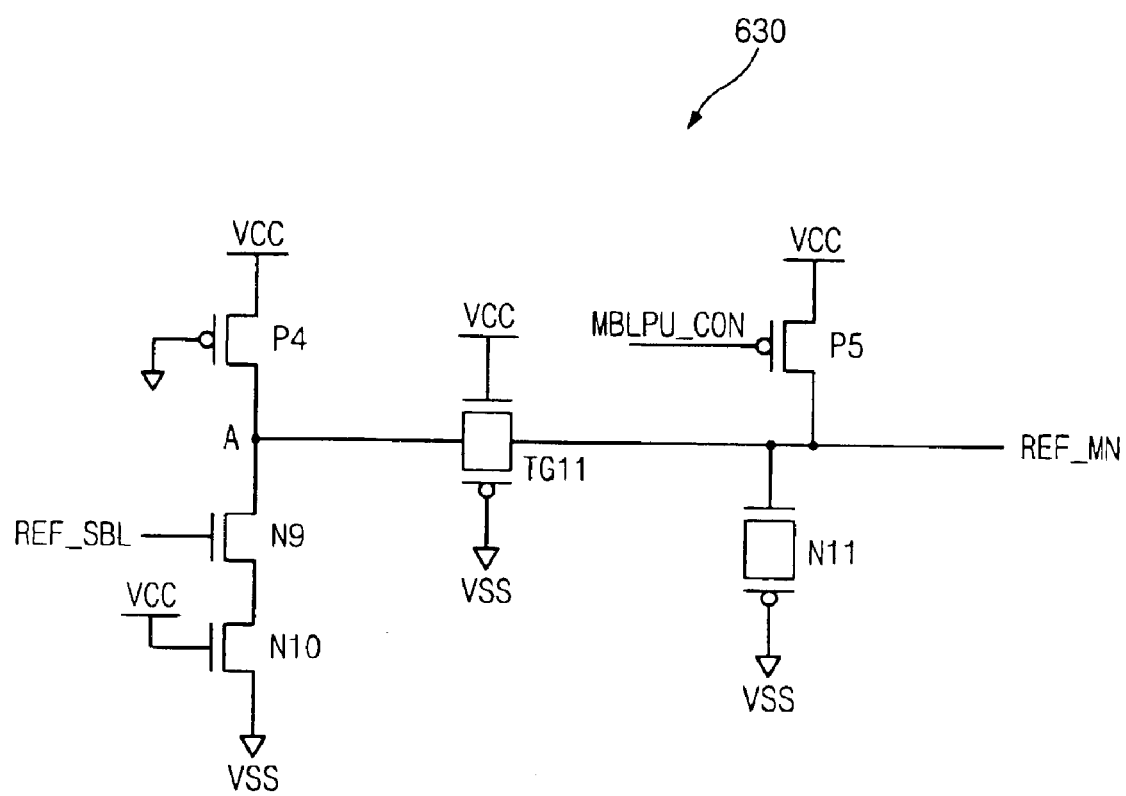
FIG. 9 is a circuit diagram of a second voltage generator of FIG. 7.

FIG. 9 is a circuit diagram of the second voltage generator 630 of FIG. 7.

The second voltage generator 630 is configured to have the same condition as the operation of inducing a sensing voltage to the main bitline MBL and outputting the induced voltage into the data bus 200 in the cell array block 100. The second voltage generator 630 induces the internal reference voltage REF_MN in response to the third reference level adjusting signal REF_SBL and output the induced internal reference voltage REF_MN.

The second voltage generator 630 comprises PMOS transistor P4 and P5, NMOS transistors N9, N10 and N11, and a transmission gate TG11. The PMOS transistor P4, connected between the power voltage VCC and a node A, has a gate connected to the ground voltage VSS. The NMOS transistors N9 and N10 are connected serially between the node A and the ground voltage VSS. The NMOS transistor N9 has a gate to receive the third reference level adjusting signal REF_SBL. The NMOS transistor N10 has a gate connected to the power voltage VCC. The transmission gate TG11 transmits a voltage of the node A into the output terminal. The PMOS transistor P5, connected between the power voltage VCC and the output terminal, has a gate to receive a control signal MBLPU_CON for pulling up the output terminal. The NMOS transistor N11 has a source and drain connected in common to the ground voltage VSS, and a gate connected to the output terminal.

The PMOS transistor P4 which applies load to the node A corresponds to the main bitline sensing load unit 120 for controlling sensing load of the main bitline MBL in the cell array block 100.

The NMOS transistor N9 induces the internal reference voltage REF_MN by regulating the amount of current in response to the third reference level adjusting signal REF_SBL. The NMOS transistor N9 corresponds to the NMOS transistor N3 for converting the voltage of the sub bitline SBL(0) into current to induce the sensing voltage of the main bitline MBL of FIG. 6.

The NMOS transistor N10 for pulling down the node A corresponds to the NMOS transistor N2 for pulling down the main bitline MBL in response to the main bitline pull-down signal MBPD of FIG. 6.

The transmission gate TG11 corresponds to the column switch unit 140. The PMOS transistor P5 for pulling up the output terminal corresponds to the main bitline pull-up controller 110.

Each element of FIG. 9 is configured to have the same size as that of the cell array block 100. The second voltage generator 630 generates the internal reference voltage REF_MN under the same condition as an operation of outputting a sensing voltage from the cell array block 100 into the data bus 100, and outputs the internal reference voltage REF_MN into the reference voltage selector 660.

Figure 10:
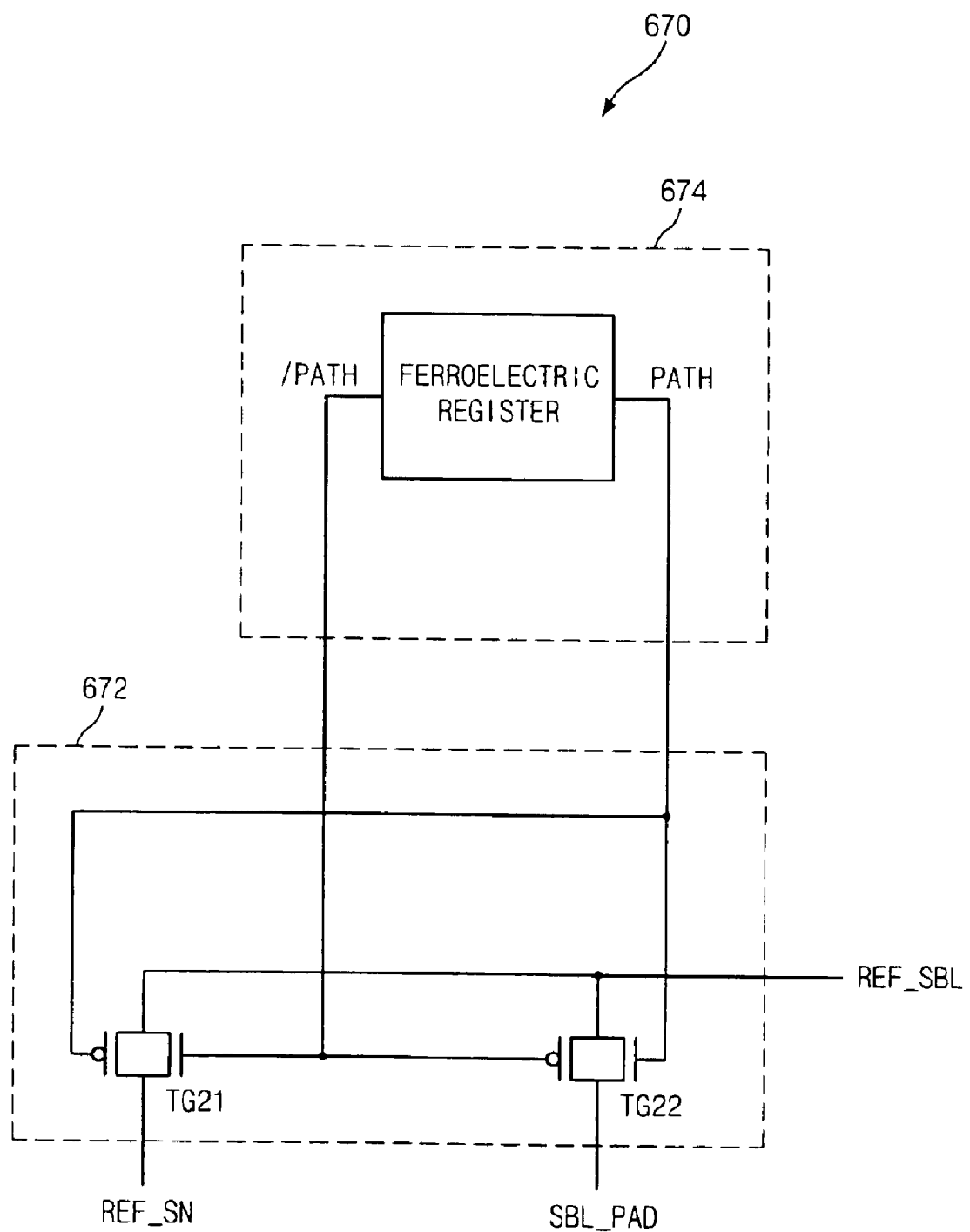
FIG. 10 is a circuit diagram of a first voltage selector of FIG. 7.

FIG. 10 is a circuit diagram of the first voltage selector 670 of FIG. 7.

The first voltage selector 670 comprises a selecting switch unit 672 and a switch regulator 674.

The selecting switch unit 672 selectively switches the first reference level adjusting signal REF_SN from the first voltage generator 620 and the second reference level adjusting signal SBL_PAD applied externally from a pad in response to path selecting signals PATH and /PATH, and outputs the selectively switched value as the third reference level adjusting signal REF_SBL. The selecting switch unit 672 comprises transmission gates TG21 and TG22 for transmitting one of the first reference level adjusting signal REF_SN and the second reference level adjusting signal SBL_PAD into the output terminal in response to the path selecting signals PATH and /PATH.

The switch regulator 674 outputs the path selecting signals PATH and /PATH set programmably into the selecting switch unit 672. The switch regulator 674 comprises a first ferroelectric register.

If the path selecting signal PATH is set as "high" and the path selecting signal PATH is set as "low" in the first ferroelectric register, the second reference level adjusting signal SBL_PAD is outputted as the third reference level adjusting signal REF_SBL. However, if the path selecting signal PATH is set as "low" and the path selecting signal /PATH is set as "high" in the first ferroelectric register, the first reference level adjusting signal REF_SN is outputted as the third reference level adjusting signal REF_SBL.

Figure 11:
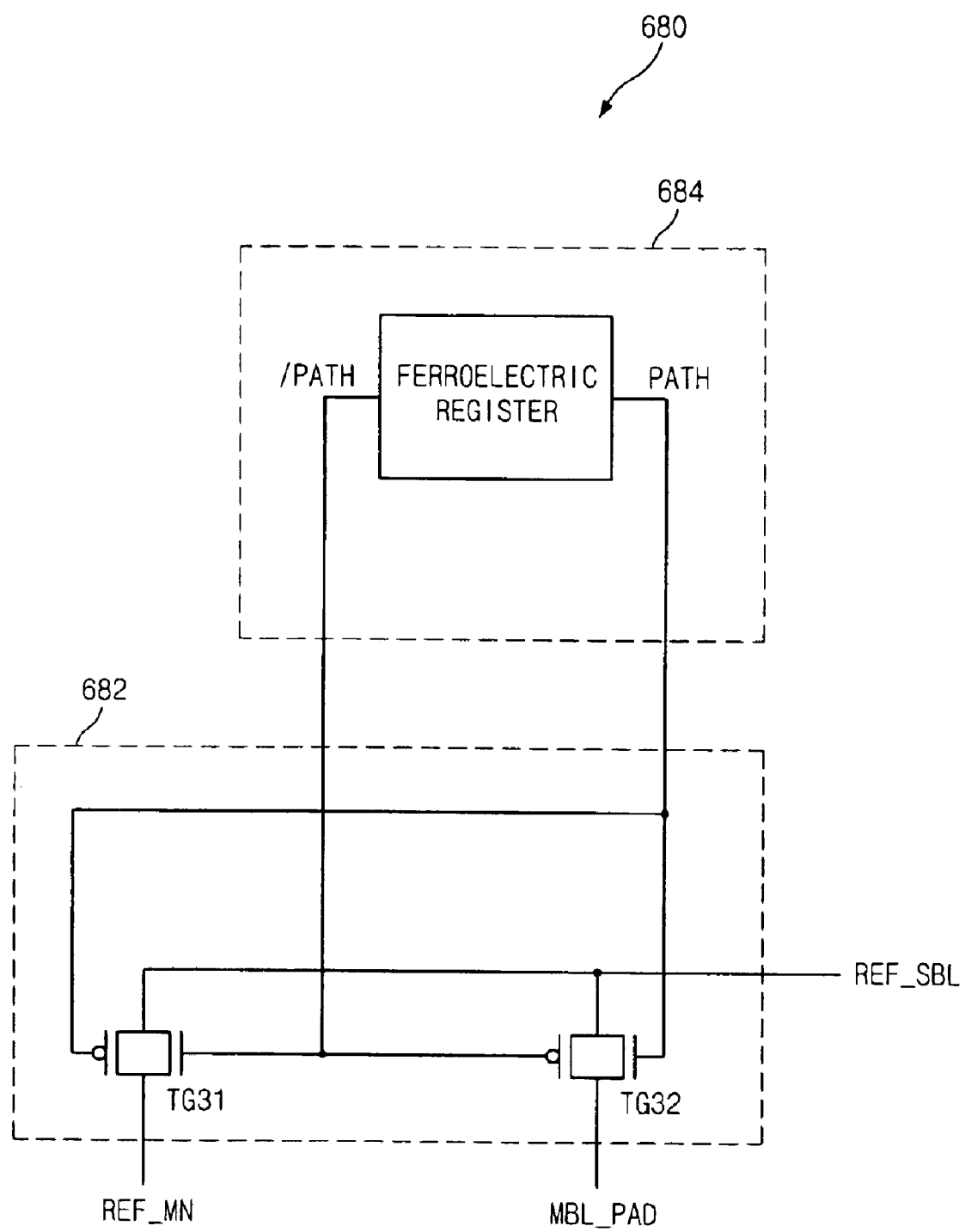
FIG. 11 is a circuit diagram of a second voltage selector of FIG. 7.

FIG. 11 is a circuit diagram of the second voltage selector 680 of FIG. 7.

The second voltage selector 680 comprises a selecting switch unit 682 and a switch regulator 684.

The selecting switch unit 682 selectively switches the internal reference voltage REF_MN from the second voltage generator 630 and the external reference voltage MBL_PAD applied externally from a pad in response to the path selecting signals PATH and /PATH, and outputs the reference voltage REF_MBL into the sense amplifier array unit 300. The selecting switch unit 682 comprises transmission gates TG31 and TG32 for transmitting one of the internal reference voltage REF_MN and the external reference voltage MBL_PAD into the output terminal in response to the path selecting signal PATH and /PATH.

The switch regulator 684 comprising a second ferroelectric register selectively outputs the path selecting signals PATH and /PATH into the selecting switch unit 682 programmably.

If the path selecting signal PATH is set as "high" and the path selecting signal PATH is set as "low" in the second ferroelectric register, the external reference voltage MBL_PAD is outputted as the reference voltage REF_MBL. However, if the path selecting signal PATH is set as "low" and the path selecting signal /PATH is set as "high" in the second ferroelectric register, the internal reference voltage REF_MN is outputted as the reference voltage REF_MBL.

Figure 12:
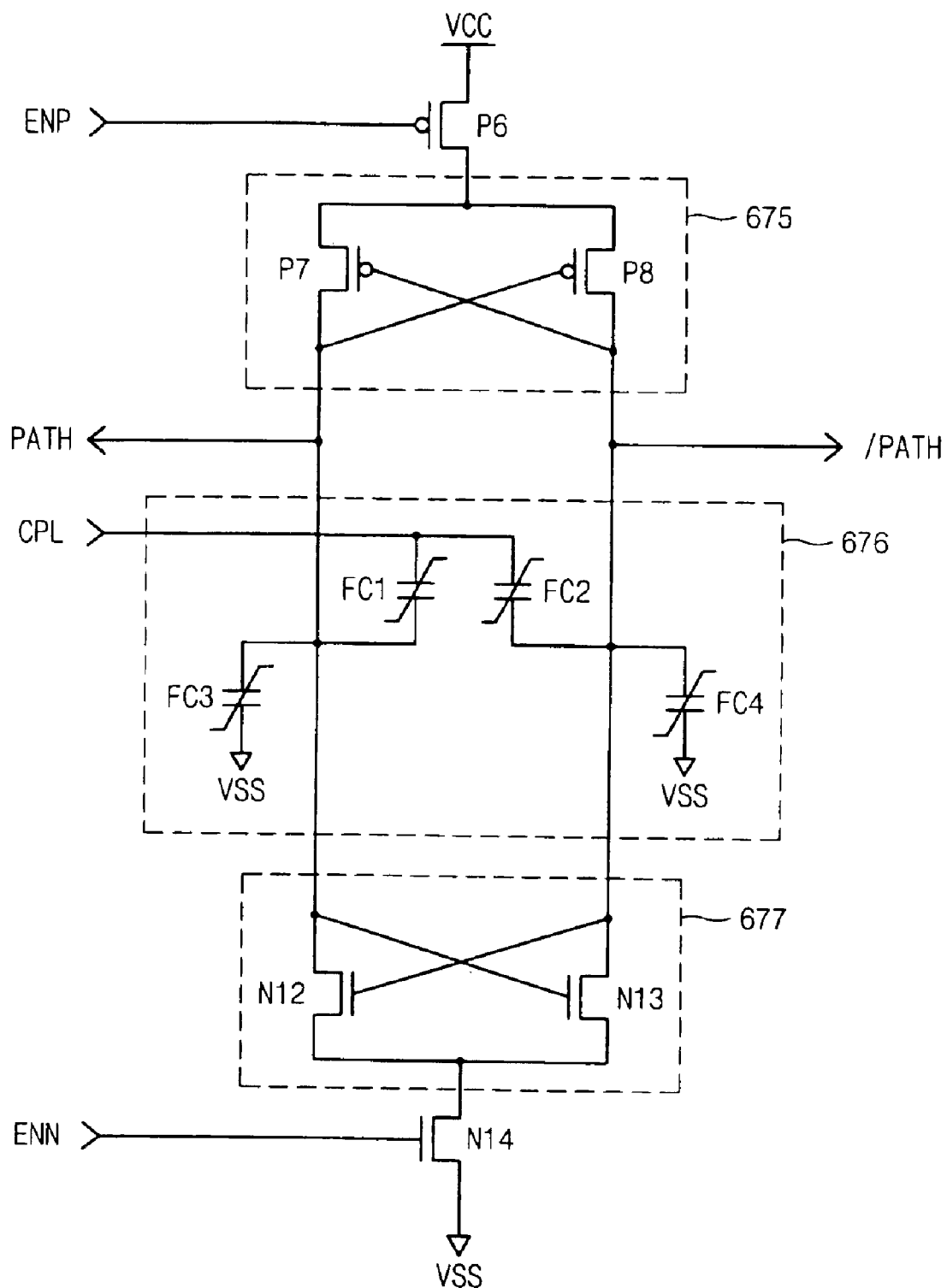
FIG. 12 is a circuit diagram of a ferroelectric register of FIGS. 10 and 11.

FIG. 12 is a circuit diagram of the ferroelectric register of FIGS. 10 and 11.

The ferroelectric register comprises a pull-up switch P6, a pull-up driver 675, a ferroelectric capacitor unit 676, a pull-down driver 677 and a pull-down switch N14.

The pull-up switch P6, connected between the power voltage VCC and the pull-up driver 675, has a gate to receive a pull-up enable signal ENP. The pull-up switch P6 applies the power voltage VCC to the pull-up driver 675 when the pull-up enable signal ENP is activated.

The pull-up driver 675 drives the power voltage VCC applied from the pull-up switch P6. The pull-up driver 675, connected between the pull-up switch P6 and the ferroelectric capacitor unit 676, comprises PMOS transistors P7 and P8 connected between both output terminals with a latch structure.

The ferroelectric capacitor unit 676 generates a voltage difference in both output terminals in response to a cell plate signal CPL, and stores applied data.

The pull-down driver 677, connected between the ferroelectric capacitor unit 676 and the pull-down switch N14, drives the ground voltage applied from the pull-down switch N14. The pull-down driver 677 comprises NMOS transistors N12 and N13 connected between both output terminals with a latch structure.

The pull-down switch N14, connected between the pull-down driver 677 and the ground voltage VSS, has a gate to receive a pull-down enable signal ENN. The pull-down switch N14 applies the ground voltage VSS to the pull-down driver 677 when the pull-down enable signal ENN is activated.

The cell plate signal CPL transits to a high level by a power-up detection pulse if power reaches a stable level. Charges stored in ferroelectric capacitors FC1 and FC2 generate a voltage difference in both output terminals by capacitance load of ferroelectric capacitors FC3 and FC4 when the cell plate signal CPL is applied with a high level. If sufficient voltage difference occurs in both output terminal of the register, the pull-up enable signal ENP and the pull-down enable signal ENN are activated to a low level and a high level, respectively, thereby amplifying data of both output terminal. After amplification of data, the cell plate signal CPL is transited to a low level again, and destroyed high data of the ferroelectric capacitor FC1 or FC2 are restored.

Figure 13:
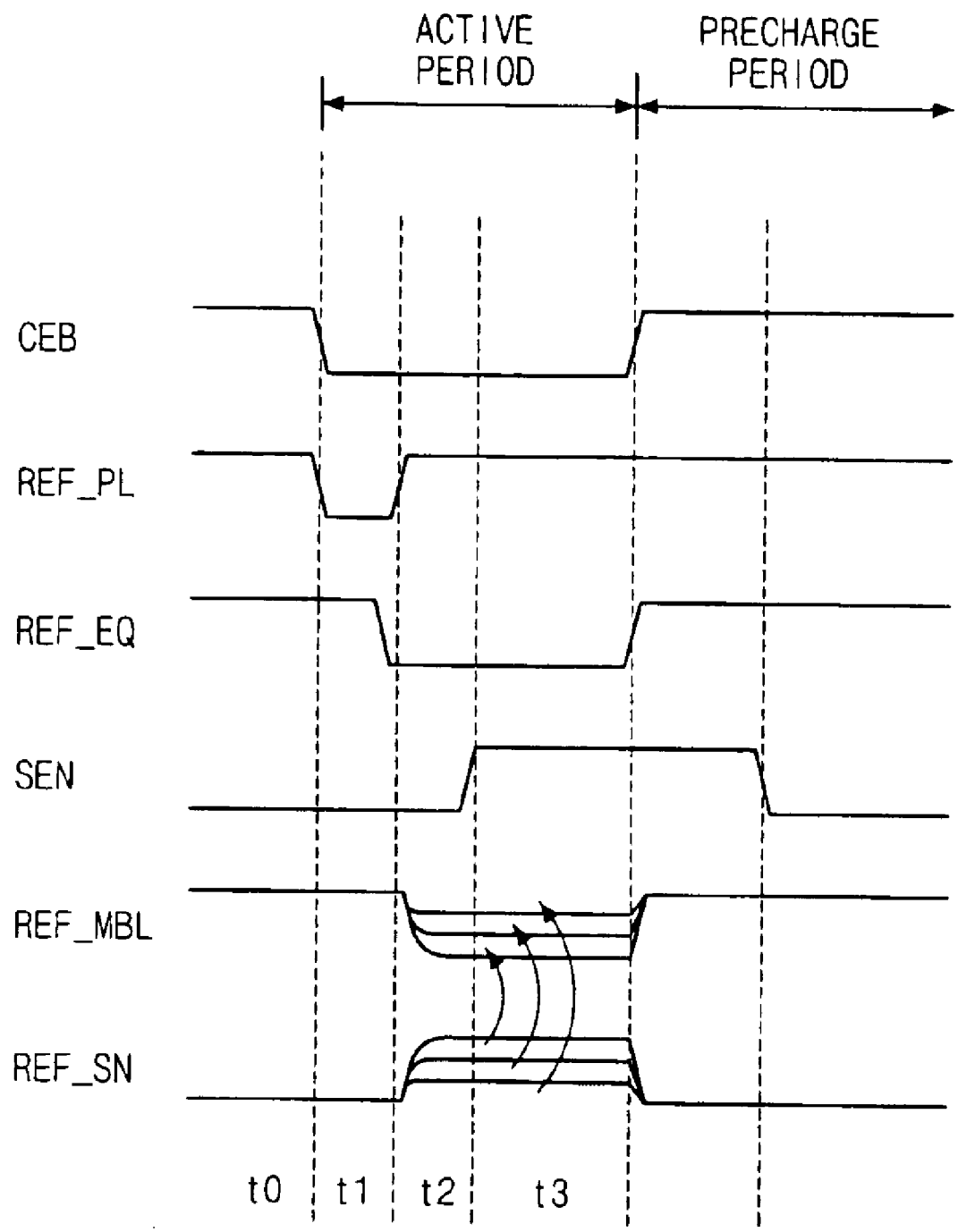
FIG. 13 is a timing diagram illustrating the operation when a voltage generated from a reference voltage generator is selected as a reference voltage.

FIG. 13 is a timing diagram illustrating the operation when a voltage generated from the reference voltage generator 610 is selected as the reference voltage REF_MBL. In other words, the path selecting signals PATH and /PATH are set as "low" and "high", respectively, in the ferroelectric registers of the switch regulators 674 and 684.

In an interval t1, if a chip enable signal CEB becomes at a low level, the driving voltage REF_PL becomes at a low level, and the reference equalizing signal REF_EQ is maintained at a high level. As a result, the first reference level adjusting signal REF_SN is precharged to a low level, and outputted into the first voltage selector 670.

Since the path selecting signals PATH and /PATH are set as "low" and "high", respectively, in the ferroelectric register of the switch regulator 674, the first voltage selector 670 applies the first reference level adjusting signal REF_SN, which is precharged to a low level, as the third reference level adjusting signal REF_SBL to a gate of the NMOS transistor N9. As a result, the NMOS transistor N9 is kept turned off, and the internal reference voltage REF_MN maintained at a high level without voltage drop is outputted into the second voltage selector 680.

Since the path selecting signal PATH and /PATH are set as "low" and "high", respectively, in the ferroelectric register of the switch regulator 684, the second voltage selector 680 selects the internal reference voltage REF_MN as the reference voltage REF_MBL, and outputs the reference voltage REF_MBL into the sense amplifier array unit 300.

In an interval t2, the driving voltage REF_PL is transited to a high level, the reference equalizing signal REF_EQ is transited to a low level. As a result, the first level adjusting signal REF_SN is generated with a predetermined level depending on ferroelectric capacitance of the voltage regulator 624.

The level of the first reference level adjusting signal REF_SN is determined by the number of the transmission gates TG00~TG0n of the voltage regulator 624 which is turned on in response to the programmably adjusted switching control signals PPC0~PPCn and PNC0~PNCn.

The first reference level adjusting signal REF_SN is converted into current by the NMOS transistor N9 of the second voltage generator 630, and pulls down the voltage of the node A in proportion to the amount of the current. As a result, the level of the internal reference voltage REF_MN is determined. The internal reference voltage REF_MN, whose level is adjusted in response to the first reference level adjusting signal REF_SN, is outputted as the reference voltage REF_MBL of the sense amplifier array unit 300 by the second voltage selector 680.

In an interval t3, if the sensing signal SEN is activated to a high level, the sense amplifiers S/A1~S/An sense and amplify a difference between the sensing voltage of each bus line BUS1~BUSn and the reference voltage REF_MBL from the reference voltage selector 660.

Accordingly, the memory device according to an embodiment of the present invention comprises the reference voltage generator 610 configured to have the same condition as that of the cell array block 100, and adjusts an output voltage of the reference voltage generator 610 programmably, thereby generating a reference voltage having any desired level internally.

Additionally, in the reference voltage selector 660 using a ferroelectric register, an internally generated voltage and an externally applied voltage can be selectively used. As a result, a cell test mode can be regulated logically without usage of additional metal lines for cell test.

Figure 14:
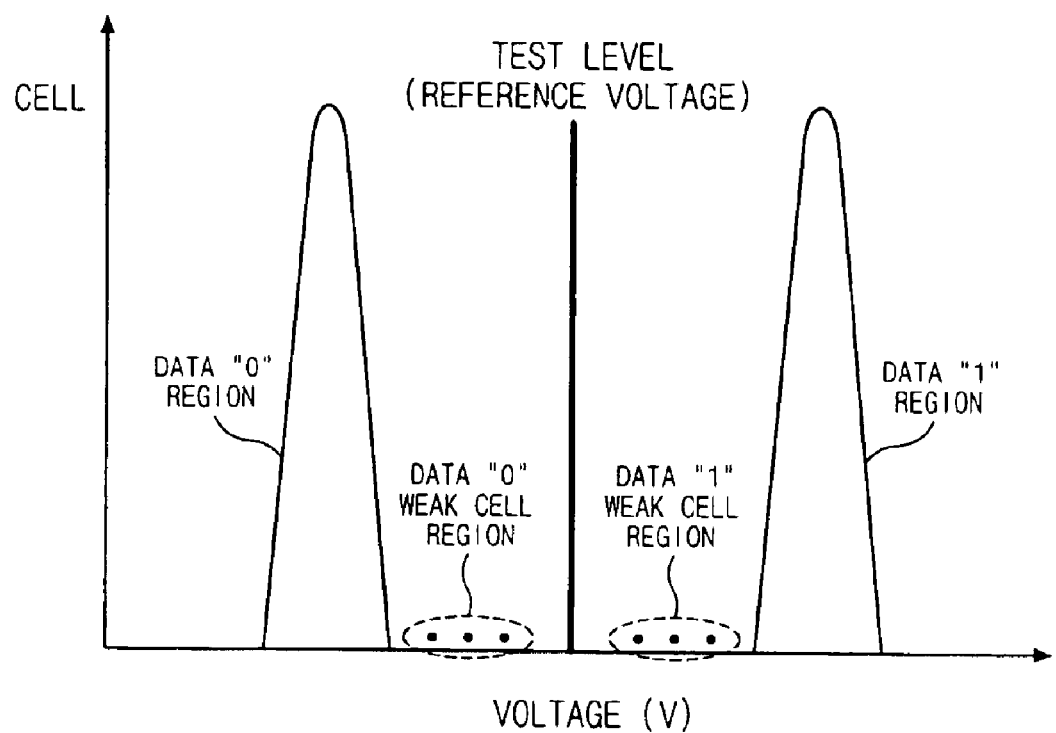
FIG. 14 is a graph illustrating distribution pattern of cell data.

FIG. 14 is a graph illustrating distribution pattern of cell data.

As the integration of the memory increases, cell failure frequently occurs. Therefore, abnormal weak cells are to be repaired for normal usage of the memory.

In an embodiment, weak cells are easily found and repaired by adjusting the level(test level) of the reference voltage REF_MBL programmably in the reference voltage controller 600.

In order to test the sensing voltage of the main bitline induced by each cell data, cells having cell data corresponding to each level of the reference voltage REF_MBL are collected while the level of the reference voltage REF_MBL is moved from a small to large value. The reference voltage REF_MBL is changed from a cell data "0" region to a cell data "1" region by regulating ferroelectric capacitance to change the level of the first reference level adjusting signal REF_SN. In this way, the cells having data values corresponding to each level are collected by comparing the variable reference voltage REF_MBL with cell data. As a result, the cell data characteristic distribution is obtained as shown in FIG. 14, and the maximum sensing margin can be secured by regulating the level of the reference voltage REF_MBL to be positioned in the center of the cell data characteristic distribution.

Figure 15:
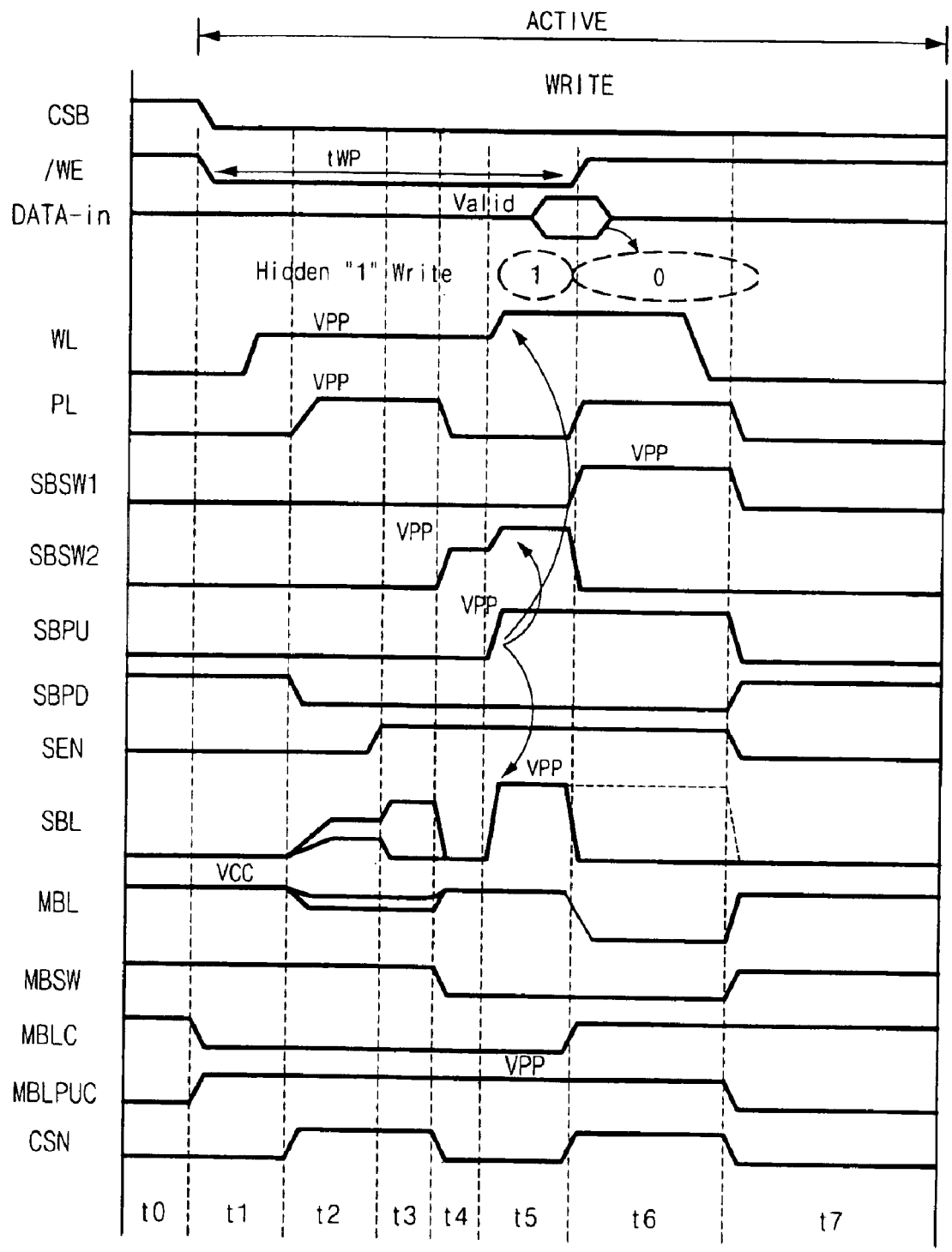
FIG. 15 is a timing diagram illustrating the write operation of the nonvolatile ferroelectric memory device according to an embodiment of the present invention.

FIG. 15 is a timing diagram illustrating the write operation of the nonvolatile ferroelectric memory device according to an embodiment of the present invention.

When an interval t1 starts, a chip selecting signal CSB and a write enable signal /WE are disabled to a low level, the write mode becomes active. Then, if the sub bitline pull-down signal SBPD and the main bitline load control signal MBLC are disabled to a low level, the main bitline pull-up control signal MBLPUC is enabled to a high level. In the above-described first embodiment, one of the main bitline load control signals MBLC(0)~MBLC(n) is activated to a low level depending on a position of the operated sub cell array.

Before a wordline WL and a plateline PL are activated, the main bitline MBL is pulled up by the main bitline pull-up control signal MBLPUC.

In an interval t2, the wrodline WL is activated and the sub bitline pull-down signal SBPD is inactivated, thereby initializing a storage node of the cell to the ground level. After initialization of the storage node, the sub bitline pull-down signal SBPD is inactivated to a low level, and the plateline PL is activated to a high level. Here, since the wordline WL is activated earlier than the plateline for a predetermined time, the cell storage node is stabilized in the initial operation, thereby improving the sensing margin.

When an interval t3 starts, if the plateline PL is enabled to a pumping voltage VPP level, a voltage level of the sub bitline SBL rises. Then, the column selecting signal CSN is enabled to connect the common data bus 200 to the main bitline MBL.

Next, when a data sensing interval t4 starts, the sense amplifier enable signal SEN is enabled to apply cell data to the main bitline MBL.

When an interval t5 starts, the plateline PL is disabled to a low level, and the sub bitline selecting signal SBSW2 is enabled to a high level. Then, the sub bitline SBL and the column selecting signal CSN are disabled to a low level.

In an interval t6, hidden data "1" is written. When the interval t6 starts, the voltage of the wordline WL rises, and the sub bitline selecting signal SBSW2 is enabled to the pumping voltage VPP level in response to the sub bitline pull-up signal SBPU. As a result, the voltage level of the sub bitline SBL rises to the pumping voltage VPP level.

During the intervals t5 and t6 where the column selecting signal CSN is at the low level, the main bitline MBL is pulled up to the power voltage VCC in response to the main bitline control signal MBLC regardless of data applied from the common data bus 200.

In an interval t7, the write enable signal /WE is enabled to write multi-level data. When the interval t7 starts, the plateline PL is enabled to the high level again. The sub bitline selecting signal SBSW1 rises to the pumping voltage VPP level, and the sub bitline selecting signal SBSW2 is disabled. Here, the main bitline control signal MBLC and the column selecting signal CSN are enabled to a high level.

While the sub bitline selecting signal SBSW1 is at the pumping voltage VPP level, data applied to the sub bitline SBL and the main bitline MBL are written in the memory cell.

Thereafter, when an interval t9 starts, the wordline WL, the plateline PL, the sub bitline selecting signal SBSW1 and the sub bitline pull-up signal SBPU are disabled. Then, the sub bitline pull-down signal SBPD is enabled, and the sense amplifier enable signal SEN is disabled. Also, the main bitline pull-up control signal MBLPUC is disabled, and the main bitline MBL is precharged to the power voltage VCC level. Here, the column selecting signal CSN is disabled to disconnect the common data bus 200 to the main bitline MBL.

Figure 16:
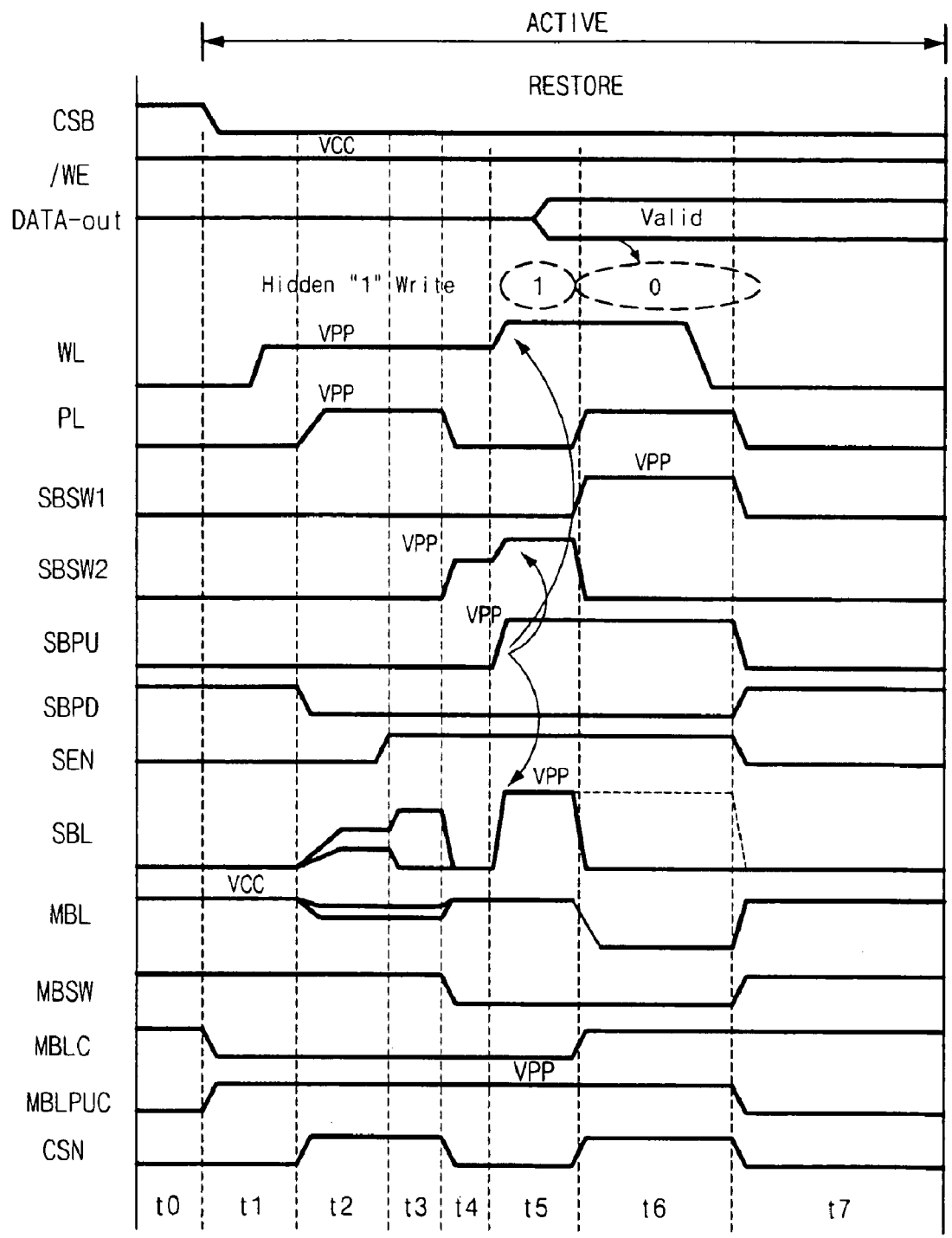
FIG. 16 is a timing diagram illustrating the read operation of the nonvolatile ferroelectric memory device according to an embodiment of the present invention.

FIG. 16 is a timing diagram illustrating the read operation of the nonvolatile ferroelectric memory device according to an embodiment of the present invention.

In a read mode, the write enable signal /WE is maintained at the power voltage VCC level. In the intervals t3 and t4, data are sensed. Hidden data "1" is written in the interval t6, and data output available interval is maintained after the interval t6.

The cell array block 100 does not write input data inputted externally through the common data bus 200 in the cell but restores read data stored in the sense amplifier array unit 300 in the cell.

In the interval t7, read data are restored. In other words, while the sub bitline selecting signal SBSW1 is at the high level, data are applied to the sub bitline SBL and the main bitline MBL by feedback decoder loop. As a result, data are restored in the memory cell.

During the interval t7 and t8, data stored in the cell array block 100 are sensed and outputted through the common data bus 10.

As described above, a nonvolatile ferroelectric memory device using a ferroelectric register according to an embodiment of the present invention can test cell characteristics without additonal mask layer processes by programmably changing a test mode using a reference voltage applied externally through a pad and an internal reference usage mode using an internally generated reference voltage. Additionally, weak cells are effectively repaired by regulating reference voltages programmably, thereby improving yield and reliability of a chip.

What is claimed is:

1. A nonvolatile ferroelectric memory device including a cell array having a multi-bitline structure for converting a sensing voltage of a sub bitline into current to induce a sensing voltage of a main bitline, the device comprising:

a plurality of cell array blocks each comprising the cell array;

a common data bus, shared by the plurality of cell array blocks, for transmitting cell data of the cell array blocks;

a sense amplifier array unit for comparing a reference voltage with cell data applied from the common data bus and for sensing the cell data; and a reference voltage controller for generating an adjustable internal reference voltage by adjusting a ferroelectric capacitance, for selectively switching the internal reference voltage and an external reference voltage applied from a pad, and for outputting the selectively switched value as the reference voltage into the sense amplifier array unit.

2. The device according to claim 1, wherein the reference voltage controller comprises:

a reference voltage generator, configured to have the same operation condition as that of the cell array block, for generating the internal reference voltage by programmablely adjusting a ferroelectric capacitance; and a reference voltage selector for selectively switching the internal reference voltage and the external reference voltage to output the reference voltage.

3. The device according to claim 2, wherein the reference voltage generator comprises:

a first voltage generator for outputting a first reference level adjusting signal having a variable level by adjusting a ferroelectric capacitance under the same operation condition to induce the sensing voltage of the sub bitline; and a second voltage generator for inducing the internal reference voltage in response to a third reference level adjusting signal under the same operation condition to induce the sensing voltage to the main bitline and output the sensing voltage into the common data bus.

4. The device according to claim 3, wherein the first voltage generator comprises:

a fixed voltage generator for outputting a voltage having a predetermined level depending on a driving voltage; and a voltage regulator for outputting a voltage having an adjustable level by adjusting a ferroelectric capacitance in response to the driving voltage and a programmably adjusted switching control signal.

5. The device according to claim 4, wherein the fixed voltage generator comprises a plurality of ferroelectric capacitors connected in parallel for receiving the driving voltage in common and outputting a charged voltage into an output terminal of the third reference level adjusting signal.

6. The device according to claim 4, wherein the voltage regulator comprises:

a plurality of ferroelectric capacitors connected in parallel for receiving the driving voltage in common and for outputting a charged voltage; and a plurality of transmission gates, connected one by one to the plurality of ferroelectric capacitors, for selectively transmitting the charged voltages of the ferroelectric capacitors into the output terminal in response to the switching control signal.

7. The device according to claim 3, wherein the reference voltage selector comprises:

a first voltage selector for selectively switching the first reference level adjusting signal and a second reference level adjusting signal applied externally from a pad, and for outputting the swithed signal as the third reference level adjusting signal; and a second voltage selector for selectively switching the internal reference voltage and the external reference voltage, and for outputting the selectively switched value into the sense amplifier array unit.

8. The device according to claim 7, wherein the first voltage selector comprises:

a selecting switch unit for selecting one of the first reference level adjusting signal and the second reference level adjusting signal in response to a first path selecting signal, and for outputting the selected signal as the third reference level adjusting signal; and a switch regulator for outputting the first path selecting signal programmably.

9. The device according to claim 8, wherein the switch regulator is a ferroelectric register where the path selecting signal is set programmably.

10. The device according to claim 7, wherein the second voltage selector comprises:

a selecting switch unit for selecting one of the internal reference voltage and the external reference voltage in response to a second path selecting signal, and for outputting the selected signal as the reference voltage; and a switch regulator for outputting the second path selecting signal programmably.

11. The device according to claim 10, wherein the switch regulator is a ferroelectric register where the path selecting signal is set programmably.

* * * * *